United States Patent
Ko

(10) Patent No.: US 6,547,122 B1
(45) Date of Patent: Apr. 15, 2003

(54) METHOD OF MOUNTING COMPONENTS ON A PLURALITY OF ABUTTED CIRCUIT BOARD

(75) Inventor: Szu-Hsiung Ko, Taipei Hsien (TW)

(73) Assignee: Acer Incorporated, Hsichih (TW)

( * ) Notice: Subject to any disclaimer, the term of this patent is extended or adjusted under 35 U.S.C. 154(b) by 0 days.

(21) Appl. No.: 09/683,802

(22) Filed: Feb. 19, 2002

(30) Foreign Application Priority Data

Oct. 24, 2001 (TW) ................................. 90126331 A

(51) Int. Cl.$^7$ ............................................. B23K 31/02
(52) U.S. Cl. ............................ 228/180.1; 228/180.21; 228/180.22
(58) Field of Search ................... 228/180.1, 180.21, 228/180.22, 39, 37; 361/728

(56) References Cited

U.S. PATENT DOCUMENTS

| | | | | |
|---|---|---|---|---|
| 3,859,723 A | * | 1/1975 | Hamer et al. | 228/108.21 |
| 4,421,265 A | * | 12/1983 | Boyer et al. | 228/180.1 |
| 4,631,100 A | * | 12/1986 | Pellegrino | 156/150 |
| 4,648,298 A | * | 3/1987 | Sutton | 211/150 |
| 4,739,919 A | * | 4/1988 | Van Den Brekel et al. | 228/180.1 |
| 4,756,928 A | * | 7/1988 | Senda et al. | 204/192.1 |
| 4,830,554 A | * | 5/1989 | Lopez | 156/150 |
| 4,867,695 A | * | 9/1989 | Speraw | 101/127 |
| 4,872,261 A | * | 10/1989 | Sanyal et al. | 101/127 |
| 5,130,893 A | * | 7/1992 | Straate et al. | 361/728 |
| 5,681,387 A | * | 10/1997 | Schmidt | 118/100 |
| 5,732,465 A | * | 3/1998 | Tokita et al. | 206/707 |
| 5,774,343 A | * | 6/1998 | Benson et al. | 211/150 |
| 5,842,874 A | * | 12/1998 | Yagi et al. | 439/540.1 |
| 5,943,213 A | * | 8/1999 | Sasov | 165/80.3 |
| 6,101,088 A | * | 8/2000 | Nakajima et al. | 312/223.2 |
| 6,198,642 B1 | * | 3/2001 | Kociecki | 307/150 |
| 6,273,327 B1 | * | 8/2001 | Murray et al. | 228/180.1 |
| 6,329,605 B1 | * | 12/2001 | Beroz et al. | 174/255 |
| 6,362,974 B1 | * | 3/2002 | Lettang | 361/728 |
| 6,484,299 B1 | * | 11/2002 | Larsen | 228/180.21 |

* cited by examiner

Primary Examiner—Tom Dunn
Assistant Examiner—L. Edmondson
(74) Attorney, Agent, or Firm—Winston Hsu

(57) ABSTRACT

A method for mounting components on an abutted circuit board. The main abutted circuit board has N first circuit boards and N second circuit boards, where N is a positive integer. Each of the abutted circuit boards has a front side and a rear side. The front sides of the first circuit boards abut on the rear sides of the second circuit boards. The method includes placing the circuit boards in a component mounter for mounting a plurality of components on the front sides of the first circuit boards and mounting a plurality of components on the rear sides of the second circuit boards. The method also includes placing the circuit boards in the component mounter for mounting a plurality of components on rear sides of the first circuit boards and mounting a plurality of components on front sides of the second circuit boards.

6 Claims, 4 Drawing Sheets

METHOD OF MOUNTING COMPONENTS ON A PLURALITY OF ABUTTED CIRCUIT BOARD

BACKGROUND OF INVENTION

1. Field of the Invention

The present invention relates to a method of mounting components on a plurality of abutted circuit boards, and more particularly, to a method of mounting components on a plurality of abutted circuit boards that requires less steel plates, components mounters, and bills of material (BOM), and artworks.

2. Description of the Prior Art

Electronic products have proven to be indispensable tools in modern life and become popular with consumers, particularly gadgets that are made extra compact and mobile such as notebooks, personal digital assistants (PDA), cellular phones, and compact disc (CD) walkmans. As a result of the reduced volume of electronic products, circuit boards used in the electronic product must also have their volume reduced. In order to reduce the volume and encompass the same components on the circuit boards, manufacturers of circuit boards mount components on a front side and a rear side of a plurality of abutted circuit boards with two component mounters. Please refer to FIG. 1a and FIG. 1b. FIG. 1a and FIG. 1b are diagrams of a prior art method for mounting components on a dual circuit board 102. The dual circuit board 102 has a first circuit board 104 and a second circuit board 106. The first circuit board 104 and the second circuit board 106 are abutted along a separating line L. Each of the circuit boards 102, 104, 106 has a front side 102a, 104a, 106a and a rear side 102b, 104b, 106b.

The front side 104a of the first circuit board 104 abuts on the front side 106a of the second circuit board 106. The first step of the method is to dispose the dual circuit board 102 in a component mounter 108a for mounting a plurality of components 110a on the front side 104a of the first circuit board 104 and mounting a plurality of components 110b on the front side 106a of the second circuit board 106.

For example, 300 components 110a are mounted on the front side 104a of the first circuit board 104, and 300 components 110b are mounted on the front side 106a of the second circuit board 106. Therefore, the front side 102a of the dual circuit board 102 has a total of 600 components. Before the dual circuit board 102 is disposed in the component mounter 108a, a first steel plate is positioned on the front side 104a of the first circuit board 104 and on the front side 106a of the second circuit board 106.

The first steel plate has a plurality of holes. Then, solder is applied onto the first steel plate so as to fill the holes with solder. After that, the first steel plate is removed so that a plurality of solder pads is mounted on the front side 104a of the first circuit board 104 and on the front side 106a of the second circuit board 106. Then, the dual circuit board 102 is placed in the component mounter 108a and infrared rays of high temperature is used to melt the solder pads such that the components 110a on the front side 104a of the first circuit board 104 and the components 110b on the front side 106a of the second circuit board 106 are soldered.

After finishing mounting components on the front side 102a of the dual circuit board 102, the dual circuit board 102 is turned over and then placed in another component mounter 108b for mounting a plurality of components 112a on the rear side 104b of the first circuit board 104 and mounting a plurality of components 112b on the rear side 106b of the second circuit board 106. For example, 40 components 112a are mounted on the rear side 104b of the first circuit board 104, and 40 components 112b are mounted on the rear side 106b of the second circuit board 106. Therefore, a rear side 102b of the dual circuit board 102 has a total of 80 components. Two separate circuit boards are formed after the separating dual circuit board 102 along the separating line L.

Before the dual circuit board 102 is placed in the component mounter 108b, a second steel plate is positioned on the rear side 104b of the first circuit board 104 and on the rear side 106b of the second circuit board 106. The second steel plate has a plurality of holes. Then, solder is applied onto the second steel plate so as to fill the holes with solder. The second steel plate is removed so that a plurality of solder pads is mounted on the rear side 104b of the first circuit board 104 and on the rear side 106b of the second circuit board 106. The dual circuit board 102 is placed in the component mounter 108b and the high temperature of infrared rays is used to melt down the solder pads so as to solder the components 112a on the rear side 104b of the first circuit board 104 and solder the components 112b on the rear side 106b of the second circuit board 106.

Please notice that the prior art method of mounting components on a dual circuit board 102 requires two bills of material (BOM) and two artworks corresponding to the component mounters 108a and 108b respectively. One bill of material is required when the component mounter 108a mounting the components 110a on the front side 104a of the first circuit board 104 and mounting the components 110b on the front side 106a of the second circuit board 106. The other bill of material is required when the component mounter 108b mounting the components 112a on the rear side 104b of the first circuit board 104 and mounting the components 112b on the rear side 106b of the second circuit board 106.

Similarly, one artwork is provided to operators for quality checking whether the components 110a on the front side 104a of the first circuit board 104 and the components 110b on the front side 106a of the second circuit board 106 are mounted in accordance with the artwork. The other artwork is provided to operators for checking whether the components 112a on the rear side 104b of the first circuit board 104 and the components 112b on the rear side 106b of the second circuit board 106 are mounted in accordance with the artwork.

However, the use of two sets of each production part increases the manufacturing cost considerably. The design of two component mounters, two steel plates, two bills of material, and two artworks increases the preparation required and also lengthens the production line.

Assume that the component mounters 108a and 108b can mount a component in one second. If the component mounters 108a and 108b work 86400 seconds each day, an expected number of products that the component mounters 108a and 108b within two days is:(1) The front side 102a of the dual circuit board 102 has a total of 600 components, so the component mounter 108a can finish 86400/600=144 semi-finished products per day.

(2) The rear side 102b of the dual circuit board 102 has a total of 80 components, so the component mounter 108b can finish 86400/80=1080 semi-finished products per day.

(3) Combined the counts from item (1) and (2), itindicates that 144*2=288 circuit boards can be finished within two days.

As mentioned above, during same given interval, the component mounting counts are significantly different between the front side and the rear side of the dual circuit board. In other words, the production rate of one side will always lag behind the other side of the dual circuit board. As a result, the prior art method has a limited maximum throughput of the circuit boards. Additionally, if there are four circuit boards, the difference between the front side and the rear side of the dual circuit board will become more significant.

SUMMARY OF INVENTION

It is therefore a primary objective of the claimed invention to provide a method for mounting components on a plurality of abutted circuit boards. The method requires less steel plates, components mounters, and bills of material (BOM), and artworks.

The numbers of components on the front side of the main abutted circuit board are the same as the number on the rear side of the main abutted circuit board. This allows the output levels of the two semi-finished products to match, increasing the output of the circuit boards. Therefore, the claimed invention can reduce the production work and cost, shorten the production line, solve the problem of unequal throughputs of the two semi-finished products, and increase the throughput of the circuit boards.

The claimed invention, briefly summarized, discloses a method for mounting components on a main abutted circuit board. The main abutted circuit board has N first circuit boards and N second circuit boards, where N is a positive integer. Each of the circuit boards has a front side and a rear side. The front sides of the first circuit boards abut on the rear sides of the second circuit boards.

The method comprises placing the main abutted circuit board in a component mounter for mounting a plurality of components on the front sides of the first circuit boards and mounting a plurality of components on the rear sides of the second circuit boards. The method further includes placing the main abutted circuit board in the component mounter for mounting a plurality of components on rear sides of the first circuit boards and mounting a plurality of components on front sides of the second circuit boards.

These and other objectives of the present invention will be apparent to those of ordinary skill in the art after reading the following detailed description of the preferred embodiment, which is illustrated in the various figures and drawings.

DETAILED DESCRIPTION

The present invention provides a method for mounting components on a main abutted circuit board. The main abutted circuit board has N first circuit boards and N second circuit boards, where N is a positive integer. Each of the circuit boards has a front side and a rear side. The front side of the main abutted circuit board is composed of the front sides of the first circuit boards abutting on the rear sides of the second circuit boards.

The first step of the method is to place the main abutted circuit board in a component mounter for mounting a plurality of components on the front sides of the first circuit boards and mounting a plurality of components on the rear sides of the second circuit boards. The next step is to turn over the main abutted circuit board and place the main abutted circuit board in the component mounter for mounting a plurality of components on rear sides of the first circuit boards and mounting a plurality of components on the front sides of the second circuit boards.

Compared with the prior art, the present inventionrequires less steel plates, components mounters, and bills of material (BOM), and artworks. Therefore, the present invention can reduce the production work and cost and also shorten the production line. The number of components on the front side of the main abutted circuit board is the same as the number on the rear side of the main abutted circuit board, allowing the output levels of the two semi-finished products to be equal. Therefore, the present invention can increase the throughput of the circuit boards. The following gives an example of present invention for mounting components on a dual circuit board.

Figure 1A:
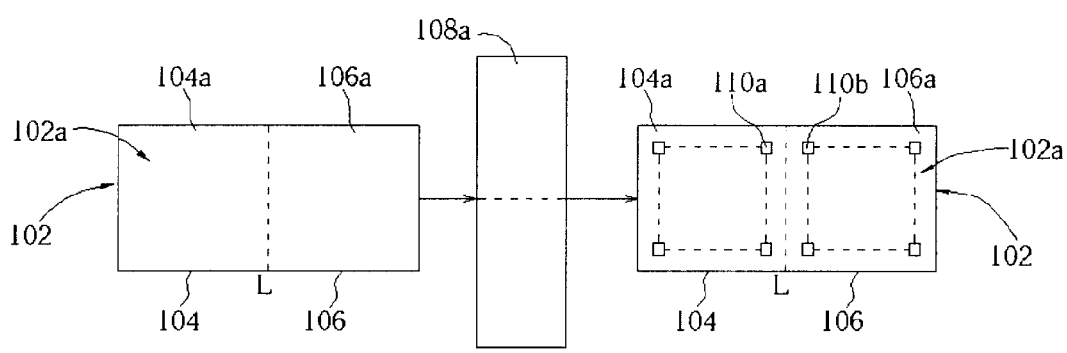
FIG. 1a and FIG. 1b are diagrams of a prior art method for mounting components on a dual circuit board.
Figure 1B:
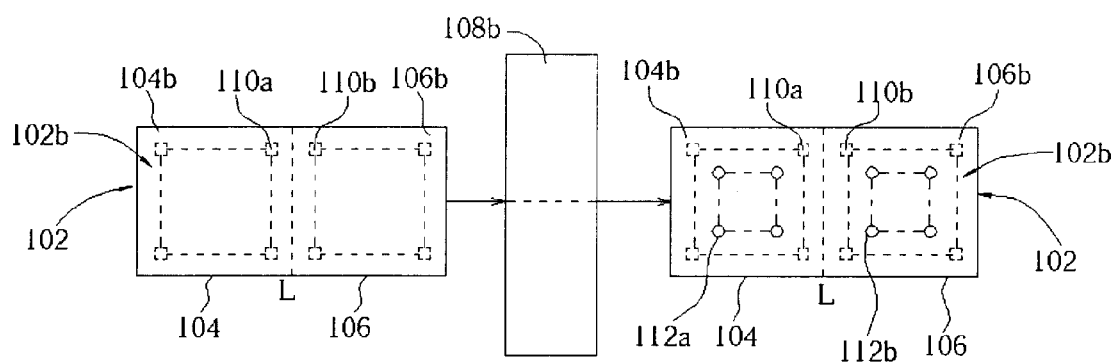
Figure 2A:
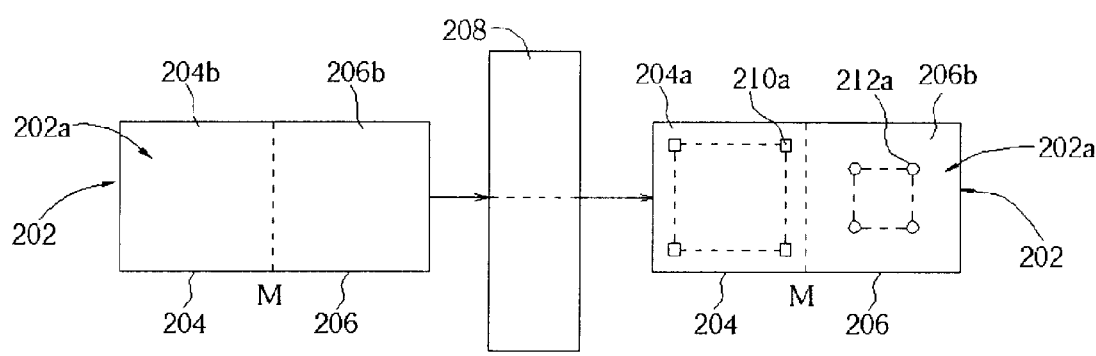
FIG. 2a and FIG. 2b are diagrams of a method for mounting components on a dual circuit board according to the present invention.
Figure 2B:
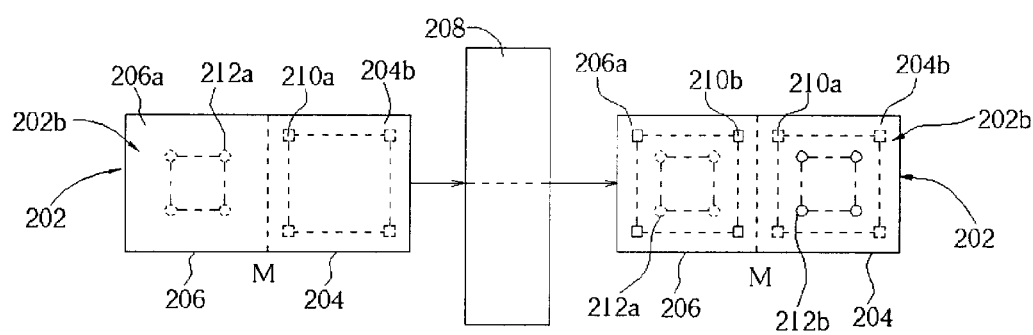

Please refer to FIG. 2a and FIG. 2b. FIG. 2a and FIG. 2b are diagrams of a method for mounting components on a dual circuit board 202 according to the present invention. The dual circuit board 202 has a first circuit board 204 and a second circuit board 206. The first circuit board 204 and the second circuit board 206 are abutted along a separating line M. Each of the circuit boards 202, 204, 206 have a front side 202a, 204a, 206a and a rear side 202b, 204b, 206b. The front side 204a of the first circuit board 204 abut on the rear side 206b of the second circuit board 206.

The first step of the method is to place the dual circuit board 202 in a component mounter 208 for mounting a plurality of components 210a on the front side 204a of the first circuit board 204 and mounting a plurality of components 212a on the rear side 206b of the second circuit board 206. For example, 300 components 210a are mounted on the front side 204a of the first circuit board 204, and 40 components 212a are mounted on the rear side 206b of the second circuit board 206. Therefore, the front side 202a of the dual circuit board 202 has a total of 340 components.

Before the dual circuit board 202 is placed in the component mounter 208, a steel plate is positioned on the front side 204a of the first circuit board 204 and on the rear side 206b of the second circuit board 206. The steel plate has a plurality of holes. Then, solder is applied onto the steel plate so as to fill the holes with solder. The steel plate is removed so that a plurality of solder pads is mounted on the front side 204a of the first circuit board 204 and on the rear side 206b of the second circuit board 206.

The dual circuit board 202 is placed in the component mounter 208 and infrared rays of high temperature is used to melt the solder pads such that the components 210a on the front side 204a of the first circuit board 204 and the components 212a on the rear side 206b of the second circuit board 206 are soldered.

The second step of the method starts with turning over the dual circuit board 202.

The rear side 202b of the dual circuit board 202 comprises the rear side 204b of the first circuit board 204 and the front side 206a of the second circuit board 206. After that, the dual circuit board 202 is placed in the component mounter 208 for mounting a plurality of components 212b on the rear side 204b of the first circuit board 204 and mounting a plurality of components 210b on the front side 206a of the second circuit board 206.

For example, 40 components 212b are mounted on the rear side 204b of the first circuit board 204, and 300 components 210b are mounted on the front side 206a of the second circuit board 206. Therefore, a rear side 202b of the dual circuit board 202 has a total of 340 components. The rear side 202b of the dual circuit board 202 has the same number of components as the front side 202a of the dual circuit board 202. Two separate circuit boards are formed after separating the dual circuit board 202 along the separating line M.

Before the dual circuit board 202 is placed in the component mounter 208, the steel plate is positioned on the rear side 204b of the first circuit board 204 and on the front side 206a of the second circuit board 206. The steel plate has a plurality of holes. Then, solder is applied onto the steel plate so as to fill the holes with solder.

The steel plate is removed so that a plurality of solder pads is mounted on the rear side 204b of the first circuit board 204 and on the front side 206a of the second circuit board 206.

The dual circuit board 202 is placed in the component mounter 208 and infrared rays of high temperature is used to melt the solder pads such that the components 212b on the rear side 204b of the first circuit board 204 and the components 210b on the front side 206a of the second circuit board 206 are soldered.

Please notice that, the present invention only requires one bill of material (BOM) and one artwork corresponding to the component mounter 208. The bill of material is required when the component mounter 208 mounting the components 210a on the front side 204a of the first circuit board 204 and mounting the components 212a on the rear side 206b of the second circuit board 206. In addition, it is also can be required when the component mounter 208 mounting the components 212b on the rear side 204b of the first circuit board 204 and mounting the components 210b on the front side 206a of the second circuit board 206.

Similarly, the artwork can not only be provided to operators for quality checking whether the components 210a on the front side 204a of the first circuit board 204 and the components 212a on the rear side 206b of the second circuit board 206 are mounted in accordance with the artwork, but also can be provided to operators for quality checking whether the components 212b on the rear side 204b of the first circuit board 204 and the components 210b on the front side 206a of the second circuit board 206 are mounted in accordance with the artwork.

Therefore, the present invention only requires a steel plate, a bill of material, and an artwork corresponding to the component mounter 208. Compared with the prior art method, the present invention requires less steel plates, components mounters, and bills of material (BOM), and artworks. Therefore, the present invention can reduce production work and cost and also shorten the production line. In the production process, the number of components on the front side 202a of the dual circuit board 202 is same as the number on the rear side 202b of the dual circuit board 202, so the output levels of the two semi-finished products can be equal. Therefore the present invention can increase the throughput of the circuit boards.

For example, assume that the component mounter 208 according to the present invention can mount a component in one second. If the component mounter 208 works 86400 seconds each day, an expected number of products that two component mounters 208 within two days is:(1) The front side 202a of the dual circuit board 202 has a total of 340 components; as a result the component mounter 208 can finish 86400/340=254 semi-finished products per day.

(2) The rear side 202b of the dual circuit board 202 has a total of 340 components; as a result the other component mounter 208 can finish 86400/340=254 semi-finished products per day.

(3) Combined the counts from item (1) and (2), it indicates that 254*2=508 circuit boards can be finished within two days.

However, assume that the component mounters 108a and 108b of the prior art method can also mount a component in one second. If the component mounters 108a and 108b work 86400 seconds each day, an expected number of products that the component mounter 108a and 108b within two days is:(1) The front side 102a of the dual circuit board 102 has a total of 600 components; as a result the component mounter 108a can finish 86400/600=144 semi-finished products per day.

(2) The rear side 102b of the dual circuit board 102 has a total of 80 components; as a result the component mounter 108b can finish 86400/80=1080 semi-finished products per day.

(3) Combined the count from item (1) and (2), it indicates that 144*2=288 circuit boards can be finished in two days.

Consequently, the present invention can produce 508 circuit boards in two days by using two component mounters 208, but the prior art method can only produce 288 circuit boards in two days by using the component mounters 108a and 108b. Therefore, the present invention can produce (508−288)/288=76% more circuit boards than the prior art method, producing far superior results.

Furthermore, the circuit board that is produced by use the present invention can not only be installed in small and portable electronic devices such as notebooks, personal digital assistants (PDA), cellular phones, and compact disk walkmans, but can also be installed in CD-ROM or DVD-ROM devices.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for mounting components on a main abutted circuit board comprising:

providing the main abutted circuit board, a front aid of the main abutted circuit board having front side of N first circuit boards and rear sides of N second circuit boards, N being a positive integer, all of the first and second circuit boards being contiguous with each other and lying in a same plane;

consulting only one bill of materials (BOM) for gathering a first number of components that will mounted on the front side of each of the N first circuit boards and a second number of components that will be mounted on the rear side of each of the N second circuit boards;

consulting only one artwork for placing the first number of components on the front side of each of the N first circuit boards and for placing the second number of components on the rear side of each of the N second circuit boards;

disposing the main abutted circuit board in only one component mounter to mount the first number of components on the front side of each first circuit board and the second number of components on the rear side of each second circuit board;

turning over the main abutted circuit board, a rear slide of the main abutted circuit board having rear sides of N first circuit boards and front sides of N second circuit boards;

consulting the BOM for gathering the second number of components that will be mounted on the rear side of each of the N first circuit boards and the first number of components that will be mounted an the front aide of each of the N second circuit boards;

consulting the artwork for placing the second number: of components on the rear side of each of the N first circuit boards and for placing the first number of components on the front side of each of the N second circuit boards;

disposing the main abutted circuit board in the component mounter to mount the second number of components on the rear side of each first circuit board and the first number of components on the front side of each second circuit board;

cutting the main abutted circuit board such that each of the N first circuit boards and the N second circuit boards is cut into individual circuit boards, wherein each of the first circuit boards and each of the second circuit boards is identical, and 2N identical circuit boards are produced.

2. The method of claim 1 wherein N is 1.

3. The method of claim 1 wherein N is 2.

4. The method of claim 1 further comprising:

positioning a plate on the front sides of the first circuit boards and on the rear sides of the second circuit boards, the plate having a plurality of holes;

applying solder onto the plate so as to fill the holes with solder; and removing the plate to mount a plurality of solder pads on the front sides of the first circuit boards and on the rear sides of the second circuit boards so as to solder components on the front sides of the first circuit boards and on the rear sides of the second circuit boards.

5. The method of claim 4 further comprising:

positioning the plate on the rear sides of the first circuit boards and on the front sides of the second circuit boards;

applying solder onto the plate when the plate is on the rear sides of the first circuit boards and on the front sides of the second circuit boards so as to fill the holes with solder; and removing the plate to mount a plurality of solder pads on the rear sides of the first circuit boards and on the front sides of the second circuit boards so as to solder components on the rear sides of the first circuit boards and on the front sides of the second circuit boards.

6. A method for mounting components on a main abutted circuit board comprising:

providing the main abutted circuit board, a front side of the main abutted circuit board having front sides of N first circuit boards and rear sides of N second circuit boards, N being a positive integer, all of the first and second circuit boards being contiguous with each other and lying in a same plane;

disposing the main abutted circuit board in a component mounter to mount a plurality of components on the front side of each first circuit board and a plurality of components on the rear side of each second circuit board;

turning over the main abutted circuit board, a rear side of the main abutted circuit board having rear sides of N first circuit boards and front sides of N second circuit boards; and disposing the main abutted circuit board in the component mounter to mount a plurality of components on the rear side of each first circuit board and a plurality of components on the front side of each second circuit board, the number,of components mounted on the rear side of each first circuit board being the same as the number of components mounted on the rear side of each second circuit board, the number of components mounted on the front side of each first circuit board being the same as the number of components mounted on the front side of each second circuit board.

* * * * *